United States Patent
Knoll et al.

(10) Patent No.: US 7,162,286 B2
(45) Date of Patent: Jan. 9, 2007

(54) SUPERCONDUCTING ARTICLES, AND METHODS FOR FORMING AND USING SAME

(75) Inventors: Allan Robert Knoll, Guilderland, NY (US); Kenneth Patrick Lenseth, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 195 days.

(21) Appl. No.: 10/614,400

(22) Filed: Jul. 3, 2003

(65) Prior Publication Data

US 2005/0003964 A1    Jan. 6, 2005

(51) Int. Cl.
*H01B 12/00* (2006.01)
*H01F 6/00* (2006.01)
*H01L 39/00* (2006.01)

(52) U.S. Cl. .................. 505/230; 428/687; 428/400
(58) Field of Classification Search ............. 505/211, 505/220, 230, 237, 238, 239, 856, 869, 909; 221/2; 428/687, 187, 400, 409, 694 SG
See application file for complete search history.

(56) References Cited

U.S. PATENT DOCUMENTS

| | | | |
|---|---|---|---|
| 5,801,124 A | 9/1998 | Gamble et al. | |
| 5,987,342 A | 11/1999 | Scudiere et al. | |
| 6,194,085 B1 * | 2/2001 | Fasano et al. | 428/620 |
| 6,230,033 B1 | 5/2001 | Scudiere et al. | |
| 6,333,210 B1 * | 12/2001 | Dubey et al. | 438/108 |
| 6,408,120 B1 * | 6/2002 | Dautartas | 385/52 |
| 6,500,568 B1 * | 12/2002 | Robbins | 428/670 |
| 6,521,355 B1 * | 2/2003 | Fasano et al. | 428/621 |
| 6,668,449 B1 * | 12/2003 | Rumsey et al. | 29/840 |
| 6,820,525 B1 * | 11/2004 | Johnson | 83/13 |
| 6,849,580 B1 * | 2/2005 | Norton et al. | 505/237 |

* cited by examiner

*Primary Examiner*—Collen P. Cooke
(74) *Attorney, Agent, or Firm*—Toler, Larson & Abel, LLP

(57) ABSTRACT

A superconducting tape is disclosed, including a substrate having a first surface and a second surface opposite the first surface, the substrate including a plurality of indicia provided on the first surface spaced apart along a length of the substrate; and a superconductor layer overlying the second surface. Also disclosed are components incorporating superconducting tapes, methods for manufacturing same, and methods for using same.

36 Claims, 5 Drawing Sheets

SUPERCONDUCTING ARTICLES, AND METHODS FOR FORMING AND USING SAME

CROSS-REFERENCE TO RELATED APPLICATION(S)

BACKGROUND

1. Field of the Invention

The present invention is generally directed to superconducting or superconductor components, and in particular, a novel superconducting tape, power components incorporating same, and methods for utilizing and manufacturing same.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high-temperature superconductors, many exist around the fabrication of a superconducting tape that can be utilized for formation of various power components. A first generation of superconducting tapes includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical shunt layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

SUMMARY

According to one aspect of the invention, a superconducting article is provided that includes a substrate having first and second surfaces opposite each other, and a superconductor layer overlying the second surface. According to this aspect, a plurality of indicia are provided on the first surface and spaced apart along a length of the substrate. The article may be in the form of a tape.

According to another aspect of the present invention, a method for manufacturing a superconductive tape is provided, including a substrate having a first surface and a second surface opposite the first surface, the substrate including a plurality of indicia provided on the first surface and spaced along a length of the substrate. Further, the method calls for subjecting the substrate to multiple processing operations, which include providing a superconductor a layer to overlie the second surface, and inspecting the superconductive tape based on the indicia. In this regard, typically the inspecting of the superconductive tape is carried out subsequent to at least one processing operation, and following inspection additional processing operations may be carried out. Alternatively, processing operations may be completed to form a complete superconductive tape, followed by an inspection of the taped based on the indicia.

According to another aspect of the present invention, a power cable is provided including a plurality of superconductive tapes, the superconductive tapes being provided in accordance with the first aspect of the present invention described above.

According to yet another aspect of the present invention, a power transformer is provided including primary and secondary windings, at least one of the windings including a wound coil of superconductive tape provided in accordance with the first aspect of the present invention.

According to yet another aspect of the present invention, a power generator is provided including a shaft coupled to a rotor which contains electromagnets comprising rotor coils, and a stator comprising a conductive winding surrounding the rotor. The rotor coils and/or the conductive winding includes a superconductive tape generally in accordance with the first aspect of the present invention described above.

According to yet another aspect of the present invention a power grid is provided, which includes multiple components for generation, transmission and distribution of electrical power. Namely, the power grid includes a power generation station including a power generator, a transmission substation including a plurality of power transformers for receiving power from the power generation station and stepping-up voltage for transmission, and a plurality of power transmission cables for transmitting power from the transmission substation. Distribution of the power is provided by utilization of a power substation for receiving power from the power transmission cables, the power substation containing a plurality of power transformers for stepping-down voltage for distribution, and a plurality of power distribution cables for distributing power to end users. According to a particular feature of this aspect of the present invention, at least one of the power grid elements described above includes a plurality of superconductive tapes, provided in accordance with the first aspect of the present invention described above.

Still further, another aspect of the present invention provides a method for laying power cable, sometimes also referred to generically as "pulling" cable. The method calls for providing a coil of power cable, and unwinding the coil while inserting the power cable into a conduit, wherein the conduit is an underground utility conduit. The structure of the power cable is described above, namely, includes a plurality of superconductive tapes in accordance with the first aspect of the present invention.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
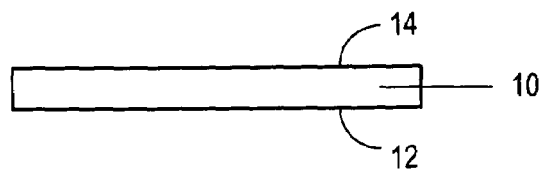
FIG. 1 illustrates a substrate, a component of a superconducting tape according to an embodiment of the present invention.

According to a first embodiment of the present invention, a superconducting tape is provided that includes a substrate having first and a second opposite surfaces. In this regard, the attention is drawn to FIG. 1 illustrating substrate 10 having first surface 12 and second surface 14 opposing the first surface 12. The substrate 10 is typically in a tape-like configuration, having a high aspect ratio. For example, the width of the tape is generally on the order of about 0.4–10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate may have an aspect ratio which is fairly high, on the order of not less than $10^3$, or even not less than $10^4$. Certain embodiments are longer, having an aspect ratio of $10^5$ and higher. As used herein, the term 'aspect ratio' is used to denote the ratio of the length of the substrate or tape to the next longest dimension, the width of the substrate or tape.

According to a particular feature according to the present invention, the substrate is marked to have a plurality of indicia provided on a back surface of the substrate, which, in the drawings herein, is illustrated as first surface 12. According to this particular feature, the indicia are provided as marks that have varying configurations and which provide various functions including the capability of indexing various positions along an extended length of the substrate 10. Several forms of indicia are provided in FIGS. 2–4. Generally speaking the indicia may contain several components, including a position identifier and a fiducial. As generally referred to herein, the term "indicia" is used in connection with the aggregate of indicia sets, each indicia set generally including position identifier, and often additionally a fiducial.

Figure 2:
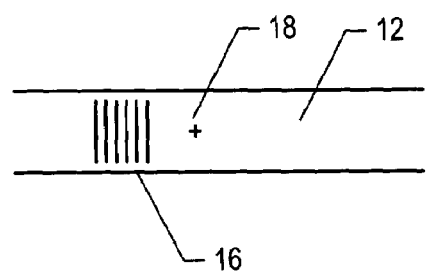
FIGS. 2–4 illustrate several different configurations of indicia provided on a first surface of the substrate.
Figure 3:
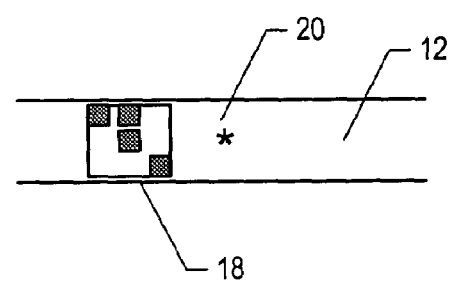
Figure 4:
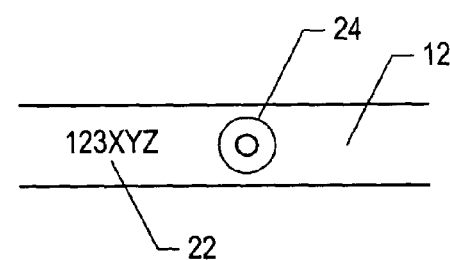

A position identifier is a marking, which is a generally unique marking among the indicia provided on a tape, which is correlated to a particular position on the substrate. The position identifier may take on various forms, such as bar code 16 shown in FIG. 2, a 2-dimensional pattern such as a 2-dimensional matrix 18 as shown in FIG. 3, or an alphanumeric code 22 as shown in FIG. 4. The indicia may be created so as to be read by automated means such as an optical reading system, or manually by an operator through visual recognition. The position identifiers are generally coded in a way so as to indicate and communicate a unique position along a length of the superconducting tape.

In addition, the indicia typically include a fiducial. A fiducial is a marking that provides for accurate positioning of the tape, such as through an automated vision system that is set-up to recognize a pre-determined shape. The fiducial may have different patterns, such as any of those widely used in commercially available vision systems. For example, a fiducial in the form of a hatching or cross-hair 18 is shown in FIG. 2. A star or asterisk 20 is shown in FIG. 3, and concentric circles 24 are shown in FIG. 4.

According to aspects of the present invention, the incorporation of indicia comprising indicia sets, each set including a position identifier and a fiducial, enables correlation of product quality to position and tracking of position for the purpose of product traceability. In these regards, highly precise location of a position along the substrate (and hence along the superconductive tape) is enabled by providing unique position identifiers that may be machine-read or human-read and further aided by the implementation of fiducials for precise positioning of the superconductive tape for various operations, such as processing operations or characterization operations at a particular location along the substrate. In this regard, generally speaking, the superconducting tape is handled in a manufacturing environment through various reel-to-reel processes and automatic scanning of indicia provide a feedback mechanism which may be utilized for active control of the rotating reels used for product manufacturing, characterization, testing and packaging.

Generally speaking, the indicia are spaced apart along the substrate at a generally constant interval or pitch, which is chosen to provide adequate resolution in data collection for the particular tape of interest. This pitch can be determined by statistical sampling or it can be determined by engineering assessment as required for the purpose at hand. Suitable pitches may be within a range of about 0.5 m to 100 m, for example. While in some cases the indicia may not span the entire length of the substrate from beginning to end, typically, the indicia span a fairly substantial portion of the tape, such as at least about 50% of the tape if not greater than about 60, 70, or even 80% of the tape. In a manufacturing setting, the use of indicia as described herein helps enable repeatable and accurate measurements of product quality at various positions along the length of the tape, such as after deposition processes to form the various layers of the superconducting tape. Typically, to enable such repeatability and accuracy, vision systems are incorporated into the manufacturing process and measurement tools so that position can be correlated to corresponding quality data. Returning to a given specific location along the tape to conduct further quality measurements can be easily accomplished by locating the appropriate position identifier and fiducial.

According to a particular embodiment, the indicia are present only along the back surface (first surface) of the substrate, and do not extend into the opposing, second surface. This is particularly important to prevent unwanted aberrations or defects in the second surface of the substrate, on which various highly sensitive layers are deposited to form a complete superconducting tape. Accordingly, typical mechanical deformation operations which imprint a pattern through physical deformation of the back surface of the substrate generally have to be implemented in such a manner so as to leave the front surface intact, or otherwise such techniques are to be generally avoided.

Examples of suitable marking techniques include laser scribing, mechanical etching, chemical etching, plasma etching, or ion beam etching, and ink printing. Of the foregoing, it is typically generally desirable to incorporate a marking system which is a subtractive process, that is, a process which removes material from the back surface of the substrate to form recesses. In this regard, recesses are less likely to be negatively altered through manufacturing and tape-handling, since the back side of the substrate typically slides against and contacts various structural components during reel-to-reel processing and handling. More precisely, it is generally desirable that the indicia be able to withstand dynamic physical contact with heating and cooling surfaces during deposition processes, which at times may cause scratches and abrasions along the back side of the tape along which the marks reside. Markings that protrude from the back surface, such as by ink printing or screening, should be integrated along the back surface in a robust manner so as to survive manufacturing and handling conditions. It is also noted that at times the superconducting tape is subjected to relatively high-temperature processes such as on the order of 500–1,000° C., optionally in oxidizing environments. Accordingly, the marking technique should also be thermally and chemically robust to survive such processing conditions.

Chemical or mechanical etching may be carried out by provision of a mask along the tape and exposing desired areas to the etching process by physical or chemical means to remove material, creating images in the back side of the tape. Laser scribing, such as by ablation or melting may also be easily implemented. In this regard, a focused laser beam is initiated so as to contact the back side, at an appropriate power to induce surface ablation and/or material flow to form images on the back side of the tape.

According to one embodiment, incoming raw tape (substrate) prior to HTS processing is inspected and marked with a laser ablation process, at constant intervals with a fiducial and a position identifier as described above. The power of the laser is maintained to prevent unwanted alteration of the front side of the tape. Automatic mark reading systems are installed in the fabrication tools, which are configured to automatically read and process markings as they pass by, such as in a reel-to-reel process, thereby reporting position and/or tape lot information with process data at all or at selected points or positions along the tape.

While the foregoing has mainly focused upon including at least one of a position identifier and a fiducial, the indicia, namely the indicia sets, may further include a lot identifier. In this case, the lot identifier may be a marking which marks a tape with a unique lot identifier, so as to distinguish one tape from another tape, or distinguish one lot of tapes from another lot of tapes. In this way, individual tapes may be distinguished from each other and the lot identifier may be linked to specific date and/or process information relevant to that particular tape or lot of tapes. The lot identifier may be incorporated into each indicia set, or only a selected set or sets. The use of lot identifiers may be particularly useful in providing technical support to end users or integrators, and may aid in troubleshooting technical issues with a particular tape. The data may also be utilized to provide real-time feedback from integrators or end users on performance, durability, etc., such that particular manufacturing process parameters associated with different lots may be evaluated and modified as necessary to further improve product quality.

According to aspects of the present invention, incorporation of indicia as described above enables provision of reliable methods to track tape during processing (manufacturing operations), so that variations in performance of the HTS coated conductor can be traced back to the source. In addition, tracking through use of the indicia may also be beneficial in providing information on specific segments of a conductor to end users, including customers such as commercial integrators or entities responsible for maintaining and/or operating a power grid or portions thereof, for whatever reasons such users may have. In these regards, description of product quality or performance is generally used to include any one of or multiple important characteristics of the superconducting tape, which include electromagnetic, mechanical and microstructural properties. Electromagnetic properties may include critical current $I_c$, critical current density $J_c$, transition temperature $T_c$, and others. Mechanical properties may include stress, strain, and others. Microstructural properties may include crystal texture, surface roughness, composition, film thickness, and others.

The present superconducting tape including a marking scheme including indicia as described herein provides numerous advantages over the state of the art. In this regard, in general, marking of wires is commonly done by ink printing through stamping, screening or jet printing, or other marking techniques. Typically, such marks are used for indicating product brand identification, part number ID, physical size (such as gauge), etc. Such commonly used marking schemes do not provide unique identifiers for finding specific or unique locations along a length of material.

More specifically, coated conductors are conventionally marked at the beginning and/or end of the conductor. When measurements are made, returning to a specific point along the coated conductor relies on winding and un-winding the material over encoder wheels to provide a readout of length. These state of the art encoders are typically highly calibrated to within a +/−0.1% accuracy. However, at extended lengths such as 1 kilometer, the desired position can be off my as much as 1 meter, making correlation of position to quality extremely difficult if not impossible. Additionally, reliance upon end-marking is subject to handling mishaps, such as when the end of a mark gets removed or "cut-off," losing the reference point permanently. On the other hand, the built-in redundancy of position identifiers and fiducial marks, along with a complementary optical recognition system for location, an inspection device can typically return to within 500 microns, most typically return within 100 or even 25 microns to a desired precise position along the tape, irrespective of the length of tape. Such precision represents a 40,000× improvement in location accuracy compared to state of the art marking techniques.

Figure 5:
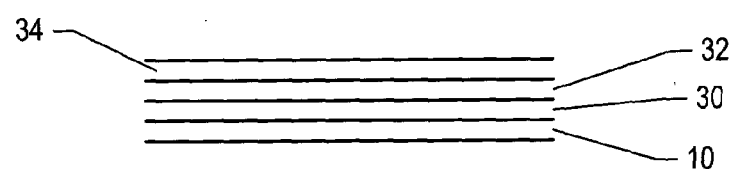
FIG. 5 illustrates a layered structure of a superconducting tape according to an embodiment of the present invention.

Turning to FIG. 5, the general layered structure of an HTS conductor according to an embodiment of the present invention is depicted. In addition to substrate 10, the HTS conductor typically includes a buffer layer 30 overlying the second surface 14 of the substrate, an HTS layer 32, followed by an noble metal layer 34. The buffer layer may be a single layer, or more commonly, be made up of several layers. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of an HTS layer having desirable crystallographic orientation for superior superconducting properties.

The high-temperature superconductor (HTS) layer 32 is typically chosen from any of the high-temperature superconducting materials that exhibit superconducting properties above the temperature of liquid nitrogen, 77 K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized.

The noble metal layer 34 is generally implemented for electrical shunting, to aid in prevention of HTS burnout in practical use. More particularly, layer 34 aids in continued flow of electrical charges along the HTS conductor in cases where cooling fails or the critical current density is exceeded, and the HTS layer moves from the superconducting state and becomes resistive. Typically, a noble metal is utilized for layer 34 to prevent unwanted interaction between noble metal layer 34 and the HTS layer 32. However, the noble metal layer 34 may be supplemented with more cost efficient conductive materials, such as copper, overlying noble metal layer 34.

Figure 6:
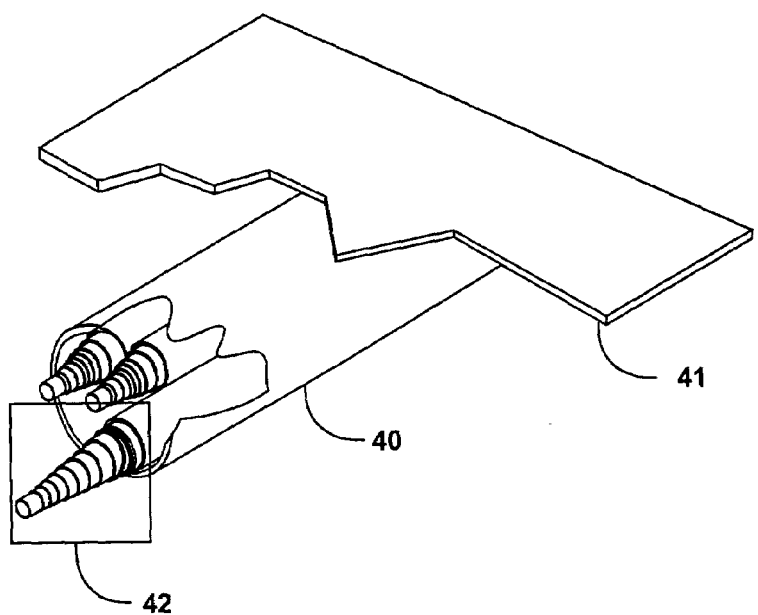
FIGS. 6 and 7 illustrate power cables incorporating superconductive tapes.
Figure 7:
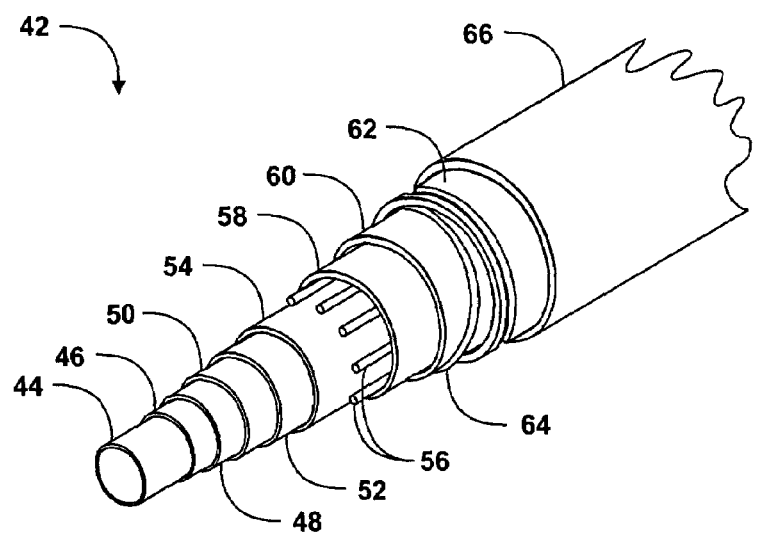

Moving away from the particular structure of the superconducting tape, FIGS. 6 and 7 illustrate implementation of a superconducting tape in a commercial power component, namely a power cable. FIG. 6 illustrates several power cables 42 extending through an underground conduit 40, which may be a plastic or steel conduit. FIG. 6 also illustrates the ground 41 for clarity. As is shown, several power cables may be run through the conduit 40.

Turning to FIG. 7, a particular structure of a power cable is illustrated. In order to provide cooling to maintain the superconductive power cable in a superconducting state, liquid nitrogen is fed through the power cable through LN2 duct 44. One or a plurality of HTS tapes 46 is/are provided so as to cover the duct 44. The tapes may be placed onto the duct 44 in a helical manner, spiraling the tape about the duct 44. Further components include a copper shield 48, a dielectric tape 50 for dielectric separation of the components, a second HTS tape 52, a copper shield 54 having a plurality of centering wires 56, a second, larger LN2 duct 58, thermal insulation 60, provided to aid in maintaining a cryogenic state, a corrugated steel pipe 62 for structural support, including skid wires 64, and an outer enclosure 66.

Figure 8:
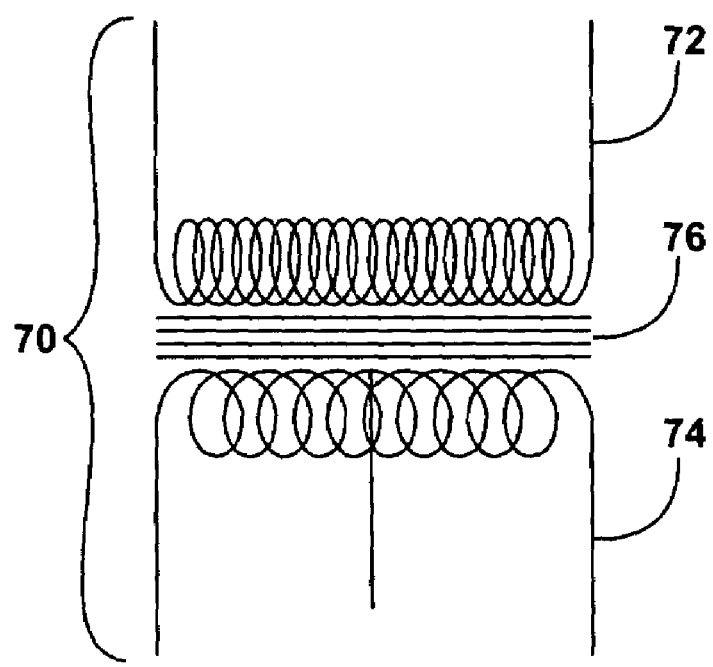
FIG. 8 illustrates a power-transformer.
Figure 9:
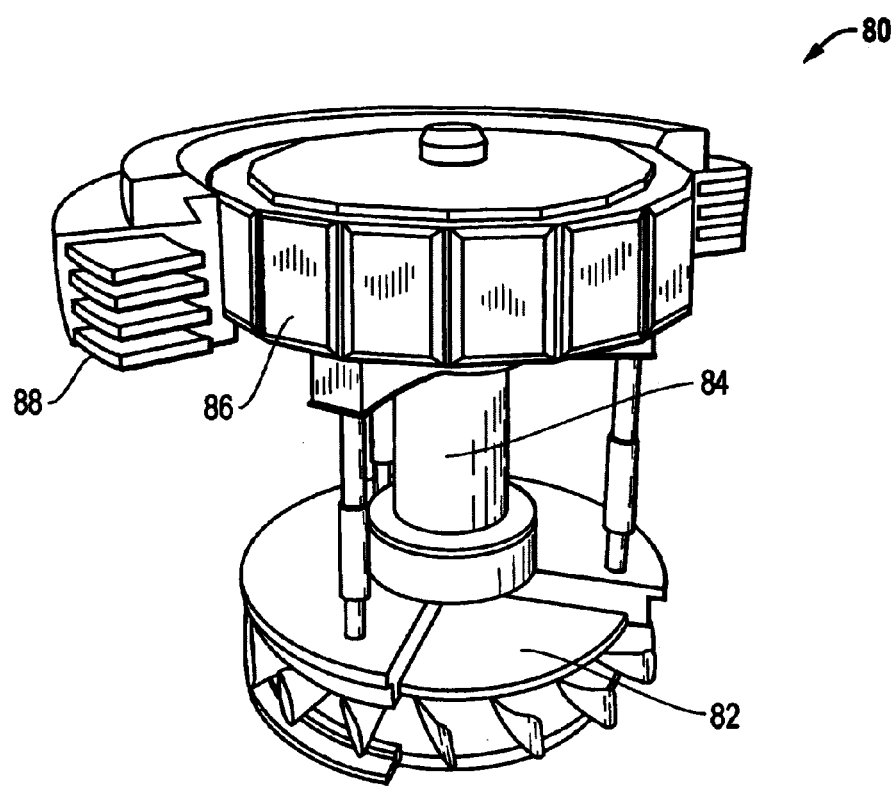

FIG. 8 illustrates schematically a power transformer having a central core 76 around which a primary winding 72 and a secondary winding 74 are provided. It is noted that FIG. 8 is schematic in nature, and the actual geometric configuration of the transformer may vary as is well understood in the art. However, the transformer includes the basic primary and secondary windings. In this regard, in the embodiment shown in FIG. 8, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive tapes in accordance with the foregoing description Turning to FIG. 9, the basic structure of a generator is provided. The generator includes a turbine 82 connected to a shaft 84 for rotatably driving a rotor 86. Rotor 86 includes high-intensity electromagnets, which are formed of rotor coils that form the desired electromagnetic field for power generation. The turbine 82, and hence the shaft 84 and the rotor 86 are rotated by action of a flowing fluid such as water in the case of a hydroelectric power generator, or steam in the case of nuclear, diesel, or coal-burning power generators. The generation of the electromagnetic field generates power in the stator 88, which comprises at least one conductive winding. According to a particular feature of the embodiment, at least one of the rotor coils and the stator winding comprises a superconductive tape in accordance with embodiments described above. Typically, at least the rotor coils include a superconductive tape, which is effective to reduce hysteresis losses.

Figure 10:
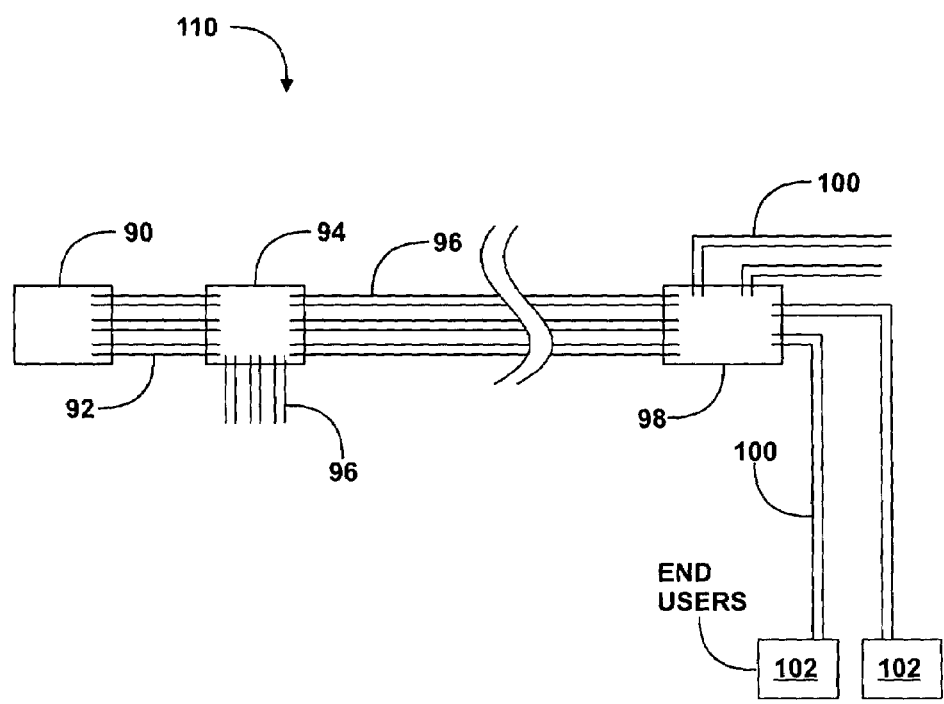
FIG. 10 illustrates a power grid according to another aspect of the present invention.

Turning to FIG. 10, a basic schematic of a power grid is provided. Fundamentally, the power grid 110 includes a power plant 90 typically housing a plurality of power generators. The power plant 90 is electrically connected and typically co-located with a transmission substation 94. The transmission substation contains generally a bank of step-up power transformers, which are utilized to step-up voltage of the generated power. Typically, power is generated at a voltage level on the order of thousands of volts, and the transmission substation functions to step-up voltages be on the order of 100,000 to 1,000,000 volts in order to reduce line losses. Typical transmission distances are on the order of 50 to 1,000 miles, and power is carried along those distances by power transmission cables 96. The power transmission cables 96 are routed to a plurality of power substations 98 (only one shown in FIG. 10). The power substations contain generally a bank of step-down power transformers, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 100 to end users 102, which include commercial end users as well as residential end users. It is also noted that individual transformers may be locally provided for individual or groups of end users. According to a particular feature, at least one of the generators provided in the power plant 90, the transformers and the transmission substation, the power transmission cables, the transformers provided in the power substation, and the power distribution cables contain superconductive tapes in accordance with the present description.

While particular aspects of the present invention have been described herein with particularity, it is well understood that those of ordinary skill in the art may make modifications hereto yet still be within the scope of the present claims.

What is claimed is:

1. A superconducting article, comprising:
  a substrate having a first surface and a second surface opposite the first surface, the substrate including a plurality of indicia provided on the first surface spaced apart along a length of the substrate at a constant pitch; and
  a superconductor layer overlying the second surface.

2. The superconductor article of claim 1, wherein the article is a superconducting tape.

3. The superconducting article of claim 2, wherein the substrate has an aspect ratio of not less than $10^3$.

4. The superconducting article of claim 2, wherein the substrate baa an aspect ratio of not less than $10^4$.

5. The superconducting article of claim 1, wherein the constant pitch is within a range of about 0.5 m to 100 m.

6. The superconducting article of claim 1, wherein the indicia are spaced apart along substantially the entire length of the substrate.

7. The superconducting article of claim 1, wherein the indicia are preset only along the first surface, and do not extend into the second surface.

8. The superconducting article of claim 1, wherein the indicia are made by at least one process from the group consisting of: laser scribing, mechanical etching, chemical etching, ink printing, plasma etching, or ion beam etching.

9. The superconducting article of claim 1, wherein the indicia are made by a material subtractive process such that the indicia comprise recesses in the first surface.

10. The superconducting article of claim 1, wherein each indicia comprises an indicia set, each indicia set including a position identifier.

11. The superconducting article of claim 10, wherein the position identifier comprises a bar code.

12. The superconducting article of claim 10, wherein the position identifier includes a 2-dimensional pattern.

13. The superconducting article of claim 10, wherein the position identifier comprises an alphanumeric code.

14. A superconducting article, comprising:
  a substrate having a first surface and a second surface opposite the first surface, the substrate including a plurality of indicia provided on the first surface spaced apart along a length of the substrate, each indicia comprising an indicia set including a unique position identifier; and
  a superconductor layer overlying the second surface.

15. The superconducting article of claim 10, wherein each indicia set further includes a fiducial for positioning the article.

16. The superconducting article of claim 15, wherein the fiducial is adapted for detection by an optical imaging system.

17. The superconducting article of claim 16, wherein the fiducial comprises a marking consisting of at least one of the following shapes: a star, concentric circles, and a crosshair.

18. The superconducting article of claim 10, wherein each indicia set further includes a lot identifier.

19. The superconducting article of claim 18, wherein the lot identifier includes manufacturing or processing date data.

20. The superconducting article of claim 1, wherein the superconductor layer comprises a high temperature superconductor material, having a critical temperature $T_c$ not less than about 77 K.

21. The superconducting article of claim 1, wherein the superconductor material comprises $REBa_2Cu_3O_{7-x}$, wherein RE is a rare earth element.

22. The superconducting article of claim 21, wherein the superconductor material comprises $YBa_2Cu_3O_7$.

23. The superconducting article of claim 1, further comprising a buffer layer provided between the superconductor layer and the substrate.

24. The superconductor article of claim 23, wherein the buffer layer includes at least one buffer film, the buffer film comprising a biaxially textured material having generally aligned crystals both in-plane and out-of-plane of the film.

25. The superconducting article of claim 1, further comprising a noble metal layer overlying the superconductor layer.

26. The superconducting article of claim 25, wherein the noble metal layer comprises silver.

27. The superconducting article of claim 1, wherein the article is a power device comprising a superconductive tape, the superconductive tape comprising said substrate and said superconductive layer.

28. The superconducting article of claim 27, wherein the power device is a power cable, said power cable comprising a plurality of superconductive tapes.

29. The superconducting article of claim 28, further comprising a conduit for passage of coolant fluid.

30. The superconducting article of claim 29, wherein the superconductive tapes are wrapped around the conduit.

31. The superconducting article of claim 28, wherein the power cable comprises a power transmission cable.

32. The superconducting article of claim 28, wherein the power cable comprises a power distribution cable.

33. The superconducting article of claim 27, wherein the power device is a power transformer, the power transformer comprising a primary winding and a secondary winding, wherein at least one of the primary winding and secondary winding is comprised of said superconductive tape.

34. The superconducting article of claim 33, wherein the secondary winding has a fewer number of windings than the primary winding, for reducing voltage.

35. The superconducting article of claim 33, wherein the primary winding has a fewer number of windings than the secondary winding, for increasing voltage.

36. The superconducting article of claim 27, wherein the power device is a power generator, the power generator comprising a shaft coupled to a rotor comprising electromagnets containing rotor coils, and a stator comprising a conductive winding surrounding the rotor, wherein at least one of the winding and the rotor coils comprises said superconductive tape.

* * * * *

UNITED STATES PATENT AND TRADEMARK OFFICE
CERTIFICATE OF CORRECTION

PATENT NO. : 7,162,286 B2
APPLICATION NO. : 10/614400
DATED : January 9, 2007
INVENTOR(S) : Michael Akira West It is certified that error appears in the above-identified patent and that said Letters Patent is hereby corrected as shown below:

Claim 4, column 9, line 28, "baa" should read --has--.

Claim 7, column 9, line 35, "preset" should read --present--.

Signed and Sealed this

Twenty-seventh Day of November, 2007

JON W. DUDAS
*Director of the United States Patent and Trademark Office*